United States Patent [19]

Arai

[11] Patent Number: 5,548,152
[45] Date of Patent: Aug. 20, 1996

[54] SEMICONDUCTOR DEVICE WITH PARALLEL-CONNECTED DIODES

[75] Inventor: Takao Arai, Tokyo, Japan

[73] Assignee: NEC Corporation, Tokyo, Japan

[21] Appl. No.: 260,832

[22] Filed: Jun. 16, 1994

[30]     Foreign Application Priority Data

Jun. 17, 1993  [JP]  Japan .................................. 5-171202

[51] Int. Cl.$^6$ ..................... H01L 23/62; H01L 29/861; H01L 29/76; H01L 31/107
[52] U.S. Cl. ..................... 257/360; 257/104; 257/288; 257/355; 257/605
[58] Field of Search .................................. 257/355, 356, 257/357, 360, 361, 362, 104, 106, 603, 605, 551, 490, 491, 494, 495, 288, 337

[56]         References Cited

FOREIGN PATENT DOCUMENTS 59-207650  11/1984  Japan ..................................... 257/360
4-215468   8/1992   Japan ..................................... 257/360

Primary Examiner—Steven H. Loke
Attorney, Agent, or Firm—Young & Thompson

[57]           ABSTRACT

A semiconductor device for electrostatic-charge protection is provided. The device includes first and second diodes parallel-connected and an MOS transistor connected serially to the second diode, all of which are provided on a semiconductor substrate. The breakdown voltages of the first and second diodes are higher than the threshold voltage of the MOS transistor. When a voltage lower than the threshold voltage is applied across a pair of electrodes of the device, the MOS transistor is open, so that only the first diode is effective, providing small capacitance between the pair of the electrodes. When a voltage equal to or higher than the threshold voltage is applied across the pair of the electrodes, the MOS transistor becomes short, so that both of the first and second diodes becomes effective. Therefore, when a voltage higher than the breakdown voltages is applied, both of the diodes absorb applied electrostatic energy, which means that the withstand voltage between the pair of the electrodes can be higher than those of the conventional ones.

9 Claims, 5 Drawing Sheets

SEMICONDUCTOR DEVICE WITH PARALLEL-CONNECTED DIODES

BACKGROUND OF THE INVENTION

1. Field of the Invention

The present invention relates to a semiconductor device and more particularly, to a semiconductor device containing diodes connected in parallel for protecting Integrated circuits (ICs) against electrostatic charges.

2. Description of the prior art

Figure 1:
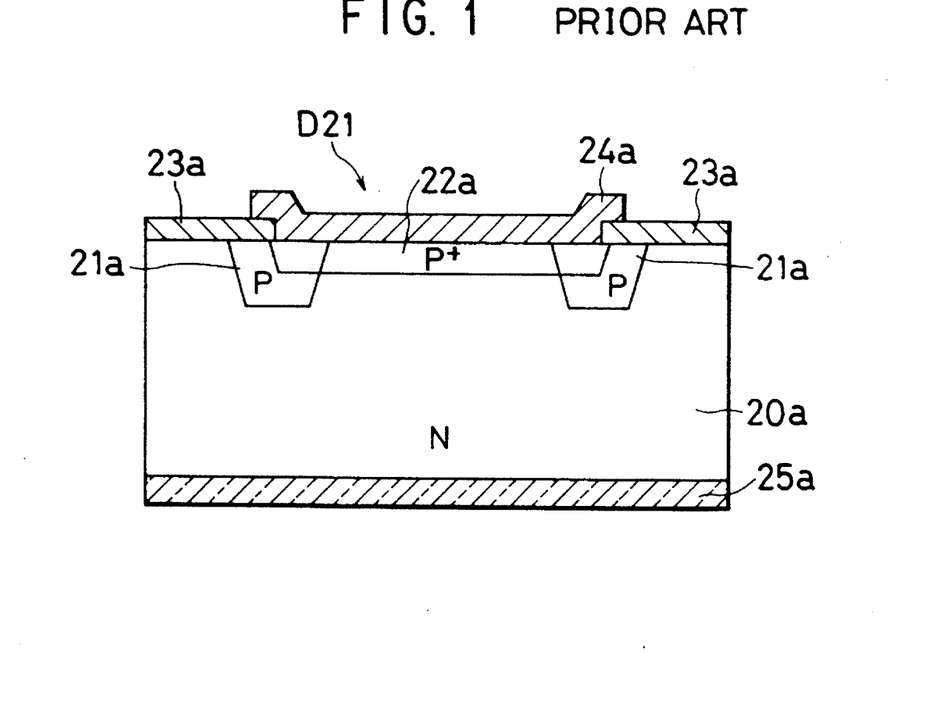
FIG. 1 is a cross-sectional view of an example of conventional semiconductor devices.

FIG. 1 shows an example of conventional semiconductor devices of this sort, in which a main P-N junction is formed by diffusion processes.

In FIG. 1, a voltage regulator diode or Zener diode D21 is provided on a first main surface of an N-type silicon substrate 20a to protect ICs (not shown) to which the diode D21 is connected against electrostatic charges.

A silicon dioxide film 23a having a window is formed on the first main surface of the substrate 20a. A P-type diffusion region 21a is formed in the substrate 20a along the periphery of the window to act as a guard ring for the diode D21. The circular-ringed diffusion region 21a is deposited in the surface. area of the substrate 20a adjacent to the first main surface.

In the surface area of the substrate 20a, there are formed a $P^+$-type diffusion region 22a for forming a p-n junction at a corresponding position to the window of the silicon dioxide film 23a. The circular diffusion region 22a is surrounded by the diffusion region 21a as the guard ring.

An anode 24a of the diode D21, which is made of a patterned conductive film, is formed on the exposed part of the substrate 20a to be in contact with its first main surface through the window of the silicon dioxide film 23a.

The N-type silicon substrate 20a and the $P^+$-type diffusion region 22a form the main P-N junction of the diode D21 at their contact area surrounded by the guard ring 21a. The fringe of the anode 24a is deposited on the silicon dioxide film 23a.

The $P^+$-type diffusion region 22a is larger in impurity or acceptor concentration than the P-type diffusion region 21a. The impurity concentration of the $P^+$-type diffusion region 22a is determined to obtain a desired breakdown voltage of the main P-N junction.

A cathode 25a of the diode D21, which is made of a patterned conductive film, is formed on the second main surface of the substrate 20a, which is opposite to the first main surface.

The anode 24a and the cathode 25a are electrically connected to given circuits (not shown) of the ICs formed on the substrate 20a, respectively, and the ICs thus electrically connected are packaged.

Figure 2:
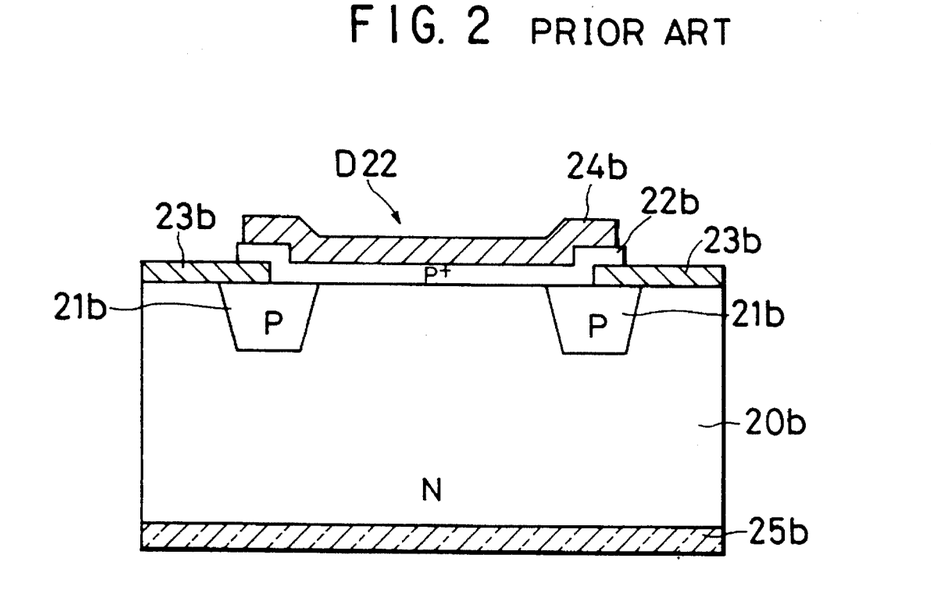
FIG. 2 is a cross-sectional view of another example of the conventional semiconductor devices.

FIG. 2 shows another example of the conventional semiconductor devices of the sort, in which a main P-N junction is formed with a polycrystalline semiconductor film.

In FIG. 2, a Zener diode D22 is provided on a first main surface of an N-type silicon substrate 20b to protect ICs (not shown) to which the diode D22 is connected against electrostatic charges.

A silicon dioxide film 23b having a window is formed on the first main surface of the substrate 20b. A P-type diffusion region 21b is formed in the substrate 20b along the periphery of the window to act as a guard ring for the diode D22. The circular-ringed diffusion region 21b is deposited in the surface area of the substrate 20b adjacent to the first main surface.

A $P^+$-type patterned polysilicon film 22b is formed on the first main surface of the substrate 20b through the window of the silicon dioxide film 23b. The polysilicon film 22b is in contact with the exposed part of the first main surface through the window to form the main P-N junction of the diode D22. In other words, the main P-N junction is formed at the contact area between the $P^+$-type polysilicon film and the N-type silicon substrate 20b and is surrounded by the diffusion region 21b as the guard ring. The fringe of the polysilicon film 22b is deposited on the silicon dioxide film 23b.

An anode 24b of the diode D22, which is made of a patterned conductive film, is formed on the $P^+$-type polysilicon film 22b.

The $P^+$-type polysilicon film 22b is larger in impurity or acceptor concentration than the P-type diffusion region 21b. The impurity concentration of the $P^+$-type polysilicon film 22b is determined to obtain a desired breakdown voltage of the main P-N junction.

A cathode 25b of the diode D22, which is made of a patterned conductive film, is formed on the second main surface of the substrate 20b, which is opposite to the first main surface.

The anode 24b and the cathode 25b are electrically connected to given circuits (not shown) of the ICs formed on the substrate 20b, respectively, and the ICs thus electrically connected are packaged.

In general, Zener diodes for protecting ICs against electrostatic charges are required to have the following electric characteristics (1) to (4).

(1) The breakdown voltage is higher than input/output signal voltages of the ICs and is lower than the withstand voltage of the ICs. For example, in case the input/output signal voltages are 5 V, the breakdown voltage should be about 6 V.

(2) The leakage current is small for restricting distortion of the input/output signal waveforms and reducing the consumption power of the ICs.

(3) The capacitance between the anode and cathode is small for restricting distortion of the input/output signal waveforms of the ICs. For example, the capacitance should be less than about 10 pF.

(4) The withstand voltage for electrostatic charges is large.

With the conventional semiconductor devices shown in FIGS. 1 and 2, there arises a problem that the withstand voltage is not high enough when the capacitance is limited to a small value in order to restrict distortion of the input/output signal waveforms because the withstand voltage is in proportion to the capacitance.

In addition, when the input/output signal voltages of the ICs are 5 V or less, there arises another problem that the conventional semiconductor devices shown in FIGS. 1 and 2 cannot protect the ICs against the electrostatic charges. The problem is due to the fact that the breakdown of the main P-N junction is almost controlled by the Zener breakdown phenomenon to increase the leakage current when the breakdown voltage of the diode is 5 V or less. For example, in case of the breakdown voltage of 4 V, the leakage current becomes very large (for example, about several milliamperes) when the input/output signal voltages are 3 V or less.

SUMMARY OF THE INVENTION

Thus, an object of the present invention is to provide a semiconductor device with a protection diode against electrostatic charges in which the protection diode is higher in withstand voltage than the conventional ones without increasing its capacitance between the anode and cathode.

Another object of the present invention is to provide a semiconductor device with a protection diode against electrostatic charges in which the protection diode is small in leakage current to be available for protecting ICs whose signal voltages are less than 5 V or less.

According to a first aspect of the present invention, a semiconductor device with a protection diode which is higher in withstand voltage than the conventional ones without increasing its capacitance.

The semiconductor device of the first aspect includes a semiconductor substrate of a first conductivity type and a first insulator film formed on its first main surface. The first insulator film has a window through which the first main surface is exposed. A first diode region of a second conductivity type is formed in the substrate. The first diode region and the substrate form a first main P-N junction of a first diode at their contact area.

A second diode region of the second conductivity type is formed in the substrate apart from the first diode region. The second diode region and the substrate form a second main P-N junction of a second diode at their contact area. A second insulator film is formed on the first main surface of the substrate so as to cover the second diode region.

A first electrode is formed on the first insulator film and in contact with the first diode region through the window of the first insulator film. A second electrode is formed on a second main surface of the substrate.

An inversion layer of the second conductivity type is formed at the first main surface between the first and second diode regions when a voltage equal to or higher than a threshold voltage is applied across the first and second electrodes, providing electrically connection between the first and second diode regions through the inversion layer.

The breakdown voltages of the first and second P-N junctions are higher than the threshold voltage, and a signal voltage applied across the first and second electrodes are lower than the threshold voltage.

The breakdown voltages of the first and second P-N junctions may be equal to or different from each other.

With the semiconductor device according to the first aspect, when a voltage lower than the threshold voltage is applied across the first and second electrodes, the first and second diode regions are insulated from each other, so that only the first diode is effective. Therefore, the capacitance between the first and second electrodes can be limited to a small value.

When a voltage equal to or higher than the threshold voltage is applied across the first and second electrodes, the first and second diode regions are electrically connected with each other through the inversion layer, so that both of the first and second diodes are effective to absorb applied electrostatic energy. Therefore, the withstand voltage between the first and second electrodes can be higher than those of the conventional ones due to increase in P-N junction area.

According to a second aspect of the present invention, a semiconductor device with a protection diode which is higher in withstand voltage than the conventional ones without increasing its capacitance.

The semiconductor device of the second aspect includes a semiconductor substrate of a first conductivity type and a first insulator film formed on its first main surface. The first insulator film has first and second windows through which the first main surface is exposed.

First and second patterned conductive films of said second conductivity type are formed on the first main surface apart from each other. The first patterned conductive film is in contact with the first main surface through the first window to form a first main P-N junction of a first diode at their contact area. The second patterned conductive film is in contact with the first main surface to form a second main P-N junction of a second diode at their contact area.

A first electrode is formed on the insulator film and in contact with the first patterned conductive film. A second electrode is formed on a second main surface of the substrate.

Similar to the semiconductor device according to the first aspect, an inversion layer of the second conductivity type is formed at the first main surface between the first and second diode regions when a voltage equal to or higher than a threshold voltage is applied across the first and second electrodes, providing electrically connection between the first and second patterned conductive films through the inversion layer.

The breakdown voltages of the first and second P-N junctions are higher than the threshold voltage, and a signal voltage applied across the first and second electrodes are lower than the threshold voltage.

The breakdown voltages of the first and second P-N junctions may be equal to or different from each other.

Preferably, the first and second patterned conductive films are made of polycrystalline semiconductor films such as a polysilicon film.

With the semiconductor device according to the second aspect, when a voltage lower than the threshold voltage is applied across the first and second electrodes, the first and second patterned conductive films are insulated from each other, so that only the first diode is effective. Therefore, the capacitance between the first and second electrodes can be limited to a small value.

When a voltage equal to or higher than the threshold voltage is applied across the first and second electrodes, the first and second patterned conductive films are electrically connected with each other through the inversion layer, so that both of the first and second diodes are effective to absorb applied electrostatic energy. Therefore, the withstand voltage between the first and second electrodes can be higher than those of the conventional ones due to increase in P-N junction area.

According to a third aspect of the present invention, a semiconductor device with a protection diode which is available for protecting ICs whose signal voltages are less than 5 V or less.

The semiconductor device of the third aspect includes a semiconductor substrate of a first conductivity type and a first insulator film formed on a first main surface of the substrate. The first insulator film has a window through which the first main surface is exposed.

A first diode region of a second conductivity type is formed in the substrate to form a first main P-N junction of a first diode at their contact area.

A second diode region of the second conductivity type is formed in the substrate apart from the first diode region to form a second main P-N junction of a second diode at their contact area. A second insulator film is formed on the first main surface so as to cover the second diode region.

A first electrode is formed on the first insulator film and in contact with the first diode region through the window, and a second electrode is formed on a second main surface of the substrate.

An inversion layer of the second conductivity type is formed at the first main surface between the first and second diode regions when a voltage equal to or higher than a threshold voltage is applied across the first and second electrodes, providing electrically connection between the first and second diode regions through the inversion layer.

The breakdown voltage of the first P-N junction is higher than the threshold voltage and the breakdown voltage of the second P-N junction is lower than the threshold voltage. A signal voltage applied across the first and second electrodes is lower than the threshold voltage.

With the semiconductor device according to the third aspect, when a voltage lower than the threshold voltage is applied across the first and second electrodes, the first and second diode regions are insulated from each other, so that only the first diode having the higher breakdown voltage is effective. Therefore, leakage current can be made small.

When a voltage equal to or higher than the threshold voltage is applied across the first and second electrodes, the first and second diode regions are electrically connected with each other through the inversion layer and at the same time, the second diode having the lower breakdown voltage becomes short or closed due to its breakdown to absorb applied electrostatic energy.

As a result, the semiconductor device is available for protecting ICs whose signal voltages are less than 5 V or less.

According to a fourth aspect of the present invention, a semiconductor device with a protection diode which is available for protecting ICs whose signal voltages are less than 5 V or less.

The semiconductor device of the fourth aspect includes a semiconductor substrate of a first conductivity type and an insulator film formed on a first main surface of the substrate. The insulator film has a window through which the first main surface is exposed.

A diode region of a second conductivity type is formed in the substrate to form a first main P-N junction of a first diode at their contact area. A patterned conductive film of the second conductivity type is formed on the first main surface apart from the diode region. The patterned conductive film is in contact with the first main surface to form a second main P-N junction of a second diode at their contact area.

A first electrode is formed on the insulator film to be in contact with the diode region through the window and a second electrode is formed on a second main surface of the substrate.

Similar to the semiconductor device of the third aspect, an inversion layer of the second conductivity type is formed at the first main surface between the diode region and the patterned conductive film when a voltage equal to or higher than a threshold voltage is applied across the first and second electrodes, providing electrically connection between the diode region and the patterned conductive film through the inversion layer.

The breakdown voltage of the first P-N junction is higher than the threshold voltage and the breakdown voltage of the second P-N junction is lower than the threshold voltage. A signal voltage applied across the first and second electrodes is lower than the threshold voltage.

Preferably, the patterned conductive film is made of a polycrystalline semiconductor film such as a polysilicon film.

With the semiconductor device according to the fourth aspect, when a voltage lower than the threshold voltage is applied across the first and second electrodes, the diode region and the patterned conductive film are insulated from each other, so that only the first diode having the higher breakdown voltage is effective. Therefore, leakage current can be made small.

When a voltage equal to or higher than the threshold voltage is applied across the first and second electrodes, the diode region and the patterned conductive film are electrically connected with each other through the inversion layer and at the same time, the second diode having the lower breakdown voltage becomes short or closed due to its breakdown to absorb applied electrostatic energy.

As a result, the semiconductor device is available for protecting ICs whose signal voltages are less than 5 V or less.

DESCRIPTION OF THE PREFERRED EMBODIMENTS

Preferred embodiments of the present invention will be described below while referring to the drawings attached.

[First Embodiment]

Figure 3:
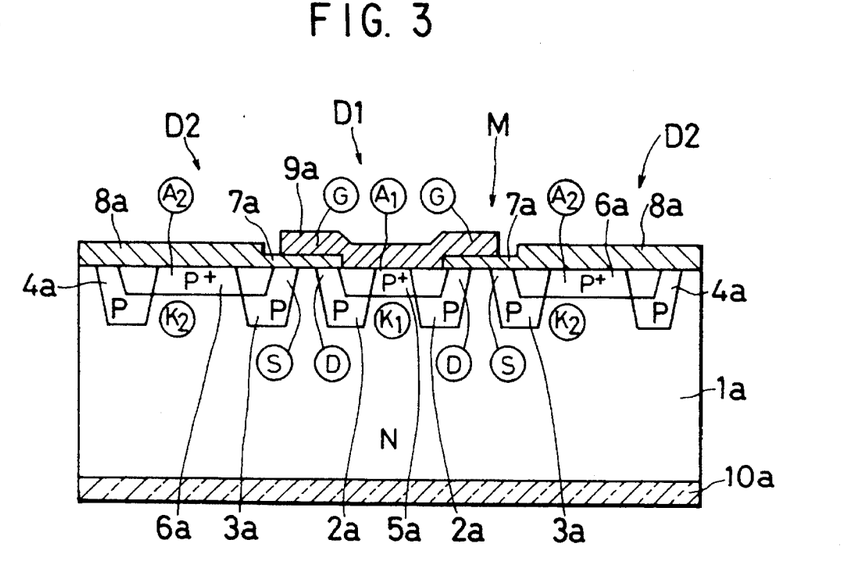
FIG. 3 is a cross-sectional view of a semiconductor device according to a first embodiment of the present invention.

In FIG. 3, first and second voltage regulator diodes or Zener diodes D1 and D2 are provided on a first main surface of an N-type silicon substrate 1a to protect ICs (not shown) to which the diodes D1 and D2 are connected against electrostatic charges.

Figure 4:
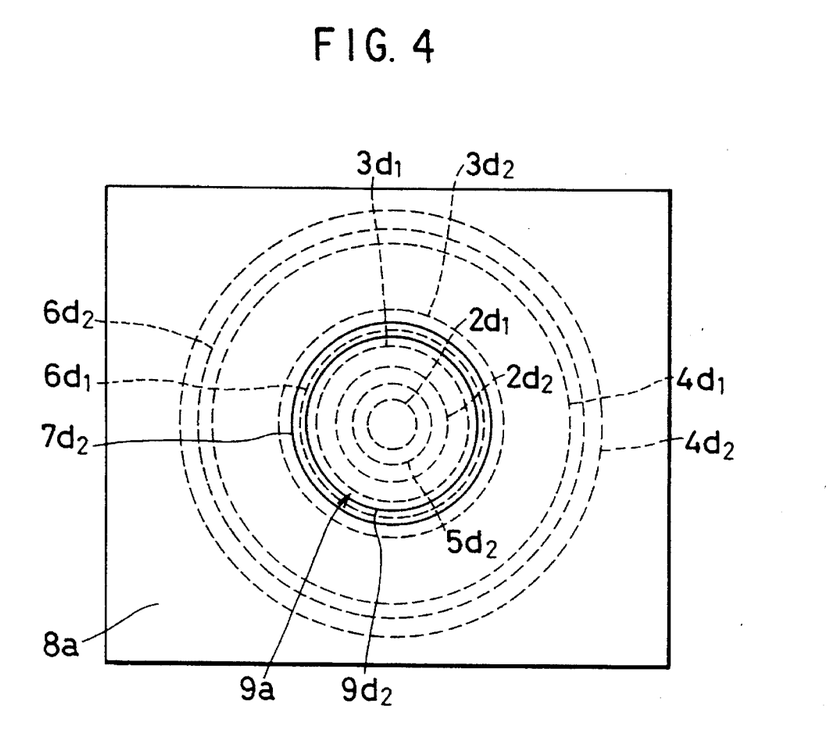
FIG. 4 is a plan view of the semiconductor device shown in FIG. 3.

A silicon dioxide film 7a having a window and a silicon dioxide film 8a are formed on the first main surface of the substrate 1a. The first main surface is exposed from the film 7a through the window. As shown in FIG. 4, the film 7a is of a circular plan shape, and the film 8a is deposited to surround the film 7a.

In the surface area of the substrate 1a, there are formed a P$^+$-type diffusion region 5a at a position corresponding to the window of the silicon dioxide film 7a. The diffusion region 5a and the substrate 1a form a main P-N junction of the first diode D1 at their contact area. The diffusion region 5a and the substrate 1a act as an anode $A_1$ and a cathode $K_1$ of the first diode D1, respectively.

A P-type diffusion region 2a is formed in the surface area of the substrate 1a along the outer edge of the $P^+$-type diffusion region 5a to act as a guard ring for the P-N junction of the first diode D1. The circular-ringed diffusion region 2a is larger in depth and smaller in impurity (acceptor) concentration than the diffusion region 5a. The diffusion region 2a is deposited along the outer edge of the diffusion region 5a.

In the surface area of the substrate 1a, there are also formed a $P^+$-type diffusion region 6a having a circular-ringed plan shape. The diffusion region 6a is deposited to surround the $P^+$-type diffusion region 5a. The diffusion region 6a and the substrate 1a form a main P-N junction of the second diode D2 at their contact area. The diffusion region 6a and the substrate 1a act as an anode $A_2$ and a cathode $K_2$ of the second diode D2, respectively.

P-type diffusion regions 3a and 4a having circular-ringed plan shapes are formed in the surface area of the substrate 1a along the inner and outer edges of the $P^+$-type diffusion region 6a, respectively. The diffusion regions 3a and 4a act as a pair of guard rings for the P-N junction of the second diode D2. The inner and outer diffusion regions 3a and 4a are deposited concentrically with the P-type diffusion region 2a and the $P^+$-type diffusion region 5a.

The circular-ringed diffusion regions 3a and 4a are larger in depth and smaller in impurity (acceptor) concentration than the diffusion region 6a.

A first electrode 9a of the semiconductor device is formed on the silicon dioxide film 7a and is in contact with the $P^+$-type diffusion region 5a through the window of the film 7a. The first electrode 9a is made of a patterned conductive film such as aluminum.

The outer edge of the $P^+$-type diffusion region 5a is deposited near a position right below the inner edge of the silicon dioxide film 7a. The inner edge of the $P^+$-type diffusion region 6a is deposited near a position right below the outer edge of the silicon dioxide film 7a.

The outer edge of the P-type diffusion region 2a and the inner edge of the P-type diffusion region 3a are apart from each other. A circular-ringed channel region is formed between the outer edge of the region 2a and the inner edge of the region 3a. The channel region is positioned right below the silicon dioxide film 7a in the surface area of the substrate 1a.

The silicon dioxide film 8a covers almost all of the $P^+$-type diffusion region 6a.

A second electrode 10a of the semiconductor device is formed on the second main surface of the substrate 1a. The second electrode 10a is made of a patterned conductive film such as gold or silver.

Figure 7:
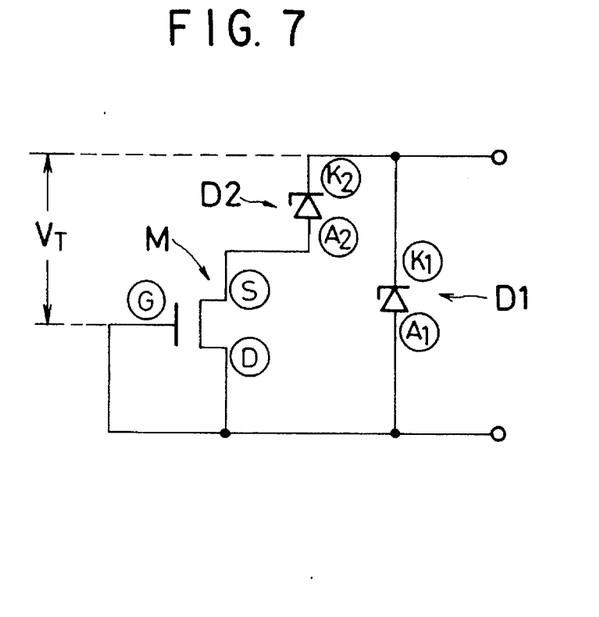
FIG. 7 is an equivalent circuit diagram of the semiconductor devices according to the first and second embodiments.

FIG. 7 shows an equivalent circuit of the semiconductor device of the first embodiment. As shown in FIG. 7, the cathodes $K_1$ and $K_2$ of the first and second diodes D1 and D2 are coupled together, the anode $A_2$ of the second diode D2 is connected to the source region S of the MOS transistor M, and the drain region S of the MOS transistor M is connected to the anode $A_1$ of the first diode D1.

When a voltage equal to or higher than a threshold voltage is applied across the first and second electrodes, a P-type inversion layer is produced in the channel region. At this time, the first electrode 9a acts as a gate G of an Metal-Oxide-Semiconductor (MOS) transistor M, the silicon dioxide film 7a acts as its gate insulator and the P-type diffusion regions 3a and 2a act its source and drain regions S and D, respectively. As a result, the diffusion regions 3a and 2a are electrically connected with each other through the inversion layer thus produced.

The breakdown voltages $V_{B1}$ and $V_{B2}$ of the first and second P-N junctions are higher than the threshold voltage $V_T$. Here, the breakdown voltages $V_{B1}$ and $V_{B2}$ are equal to each other. A signal voltage $V_S$ applied across the first and second electrodes 9a and 10a are lower than the threshold voltage $V_T$.

The semiconductor device as described above is fabricated through the following process sequence.

First, a silicon dioxide film is deposited on the first main surface of the N-type silicon substrate 1a, and a window is formed in the silicon dioxide film using a patterned photoresist film. A P-type impurity or an acceptor is selectively diffused into the substrate 1a through the window to form the P-type diffusion regions 2a, 3a and 4a as the guard rings using the patterned silicon dioxide film.

Next, the silicon dioxide film thus used as a mask is removed. A silicon dioxide film is deposited on the first main surface of the substrate 1a, and a window is formed in the silicon dioxide film using a patterned photoresist film. A P-type impurity or an acceptor is selectively diffused into the substrate 1a through the window to form the $P^+$-type diffusion regions 5a and 6a as the anodes $A_1$ and $A_2$ of the respective diodes D1 and D2 using the patterned silicon dioxide film. The impurity concentration in this process is higher than that of the prior diffusion process and is controlled so that the desired breakdown voltages $V_{B1}$ and $V_{B2}$ are obtained.

After the silicon dioxide film thus used as a mask is removed, the silicon dioxide films 7a and 8a are deposited on the first main surface of the substrate 1a in sequence.

To control the threshold voltage $V_T$ of the MOS transistor, a P-type impurity is ion-implanted into the channel region between the P-type diffusion regions 2a and 3a through the silicon dioxide film 7a.

The first and second electrodes 9a and 10a are formed by an evaporation method. Then, a pellet of the semiconductor device is obtained.

In FIG. 4, a circular line $5d_2$ shows the outer edge of the $P^+$-type diffusion region 5a, and circular lines $2d_1$ and $2d_2$ show the inner and outer edges of the P-type diffusion region 2a, respectively. Circular lines $3d_1$ and $3d_2$ show the inner and outer edges of the P-type diffusion region 3a, respectively. Circular lines $6d_1$ and $6d_2$ show the inner and outer edges of the $P^+$-type diffusion region 6a, respectively. Circular lines $4d_1$ and $4d_2$ show the inner and outer edges of the P-type diffusion region 4a, respectively. A circular line $9d_2$ shows the outer edge of the first electrode 9a and a circular line $7d_2$ shows the outer edge of the silicon dioxide film 7a.

With the semiconductor device according to the first embodiment, when the signal voltage $V_S$ lower than the threshold voltage $V_T$ is applied across the first and second electrodes 9a and 10a, the $P^+$-type diffusion regions 5a and 6a are insulated from each other, so that only the first diode D1 is effective.

Therefore, the capacitance between the first and second electrodes 9a and 10a can be limited to a small value.

When the signal voltage $V_S$ equal to or higher than the threshold voltage $V_T$ is applied across the first and second electrodes 9a and 10a, the $P^+$-type diffusion regions 5a and 6a are electrically connected with each other through the inversion layer, so that both of the first and second diodes D1 and D2 are effective to absorb applied electrostatic energy.

Therefore, the withstand voltage between the first and second electrodes 9a and 10a can be several times as high as those of the conventional ones or more due to increase in P-N junction area.

For example, in case that the signal voltage $V_S$ is 5 V or less, the breakdown voltages $V_{B1}$ and $V_{B2}$ are set to be about 6 V and the threshold voltage $V_T$ is controlled to be about 5.5 V. When the signal voltage $V_S$ is 5 V or less, only the first diode D1 is effective so that the capacitance between the first and second electrodes 9a and 10a is small.

When the signal voltage $V_S$ is higher than the threshold voltage $V_T$ or 5.5 V and lower than the breakdown voltages $V_{B1}$ and $V_{B2}$ or 6 V, both of the first and second diodes D1 and D2 are effective to increase the P-N junction area. The capacitance becomes larger dependent upon increase in the signal voltage $V_S$.

When the signal voltage $V_S$ is higher than the breakdown voltages $V_{B1}$ and $V_{B2}$ or 6 V, both of the first and second diodes D1 and D2 are broken down to absorb applied electrostatic energy, so that the withstand voltage between the first and second electrodes 9a and 10a becomes several times as high as those of the conventional ones or more.

In addition, when the inner diameter of the P-type diffusion region 3a as the guard ring of the second diode D2 is about 80 μm or less, the capacitance between the first and second electrodes 9a and 10a is about 10 pF or less, which is very small, under application of the signal voltage $V_S$ is lower than the threshold voltage $V_T$.

[Second Embodiment]

Figure 5:
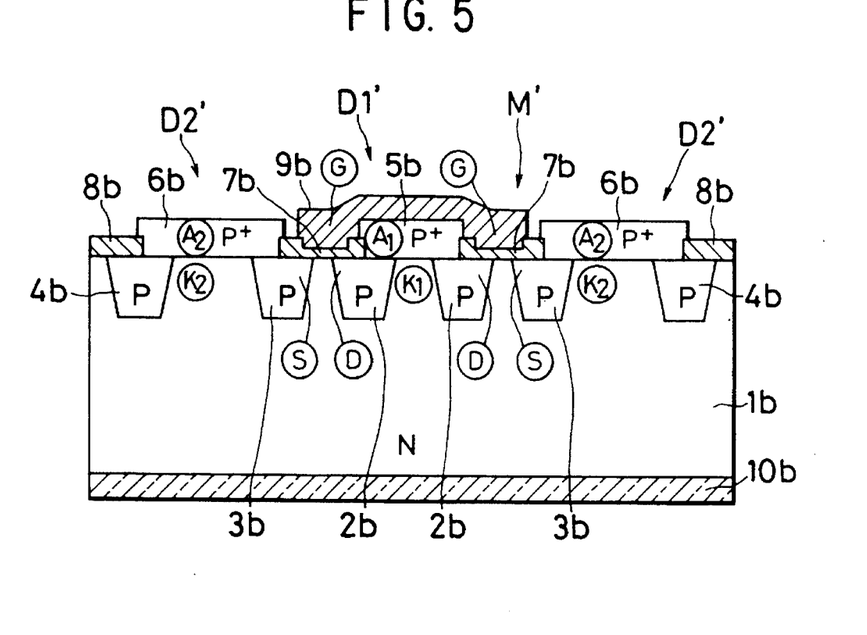
FIG. 5 is a cross-sectional view of a semiconductor device according to a second embodiment of the present invention.

In FIG. 5, first and second voltage regulator diodes or Zener diodes D1' and D2' are provided on a first main surface of an N-type silicon substrate 1b to protect ICs (not shown) to which the diodes D1' and D2' are connected against electrostatic charges.

Figure 6:
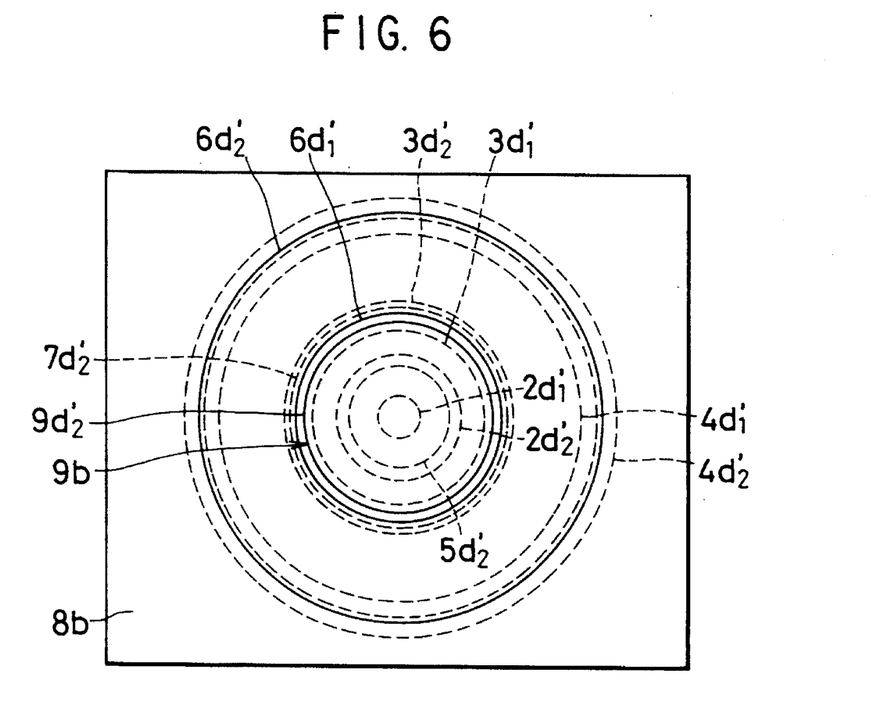
FIG. 6 is a plan view of the semiconductor device shown in FIG. 5.

A silicon dioxide film 7b having a first circular window and a silicon dioxide film 8b having a circular-ringed second window are formed on the first main surface of the substrate 1b. The first main surface is exposed from the film 7b through the first window and from the film 8b through the second window. As shown in FIG. 6, the film 7b is of a circular-ringed plan shape and is deposited between the first and second windows, the outer edge of which is shown as $7d'_2$.

On the first main surface of the substrate 1b, there is formed a $P^+$-type patterned polysilicon film 5b in the first window of the silicon dioxide film 7b. The polysilicon film 5b and the substrate 1b form a main P-N junction of the first diode D1' at their contact area. The polysilicon film 5b and the substrate 1b act as an anode $A_1$ and a cathode $K_1$ of the first diode D1', respectively.

A P-type diffusion region 2b is formed in the surface area of the substrate 1b along the periphery of the first window to act as a guard ring for the P-N junction of the first diode D1'. The circular-ringed diffusion region 2b is smaller in impurity (acceptor) concentration than the polysilicon film 5b. The diffusion region 2b is deposited along the outer edge of the diffusion region 5b.

On the first main surface of the substrate 1b, there is also formed a $P^+$-type polysilicon film 6b having a circular-ringed plan shape in the second window of the silicon dioxide film 8b. The polysilicon film 6b is deposited to surround the $P^+$-type polysilicon film 5b. The polysilicon film 6b and the substrate 1b form a main P-N junction of the second diode D2' at their contact area. The polysilicon film 6b and the substrate 1b act as an anode $A_2$ and a cathode $K_2$ of the second diode D2', respectively.

P-type diffusion regions 3b and 4b having circular-ringed plan shapes are formed in the surface area of the substrate 1b along the inner and outer edges of the second window, respectively. The diffusion regions 3b and 4b act as a pair of guard rings for the P-N junction of the second diode D2'. The inner and outer diffusion regions 3b and 4b are deposited concentrically with the P-type diffusion region 2b and the $P^+$-type polysilicon film 5b.

The diffusion regions 3b and 4b are smaller in impurity (acceptor) concentration than the polysilicon film 6b.

A first electrode 9b of the semiconductor device is formed on the silicon dioxide film 7b and is in contact with the $P^+$-type polysilicon film 5b through the first window of the silicon dioxide film 7b. The first electrode 9b is made of a patterned conductive film such as aluminum.

The outer edge of the P-type diffusion region 2b and the inner edge of the P-type diffusion region 3b are apart from each other. A circular-ringed channel region is formed between the outer edge of the region 2b and the inner edge of the region 3b. The channel region is positioned right below the silicon dioxide film 7b in the surface area of the substrate 1b.

A second electrode 10b of the semiconductor device is formed on the second main surface of the substrate 1b. The second electrode 10b is made of a patterned conductive film such as gold or silver.

An equivalent circuit of the semiconductor device of the second embodiment is the same as that in FIG. 7.

When a voltage equal to or higher than a threshold voltage is applied across the first and second electrodes 9b and 10b, a P-type inversion layer is produced in the channel region. At this time, the first electrode 9b acts as a gate G of an MOS transistor M', the silicon dioxide film 7b acts as its gate insulator and the P-type diffusion regions 3b and 2b act its source and drain regions S and D, respectively. As a result, the diffusion regions 3b and 2b are electrically connected with each other through the inversion layer thus produced.

Similar to the first embodiment, the breakdown voltages $V_{B1}$ and $V_{B2}$ of the first and second P-N junctions are higher than the threshold voltage $V_T$. A signal voltage $_S$ applied across the first and second electrodes 9b and 10b are lower than the threshold voltage $V_T$.

The semiconductor device of the second embodiment as described above is fabricated through the following process sequence.

First, a silicon dioxide film is deposited on the first main surface of the N-type silicon substrate 1b, and a window is formed in the silicon dioxide film using a patterned photoresist film. A P-type impurity or an acceptor is selectively diffused into the substrate 1b through the window to form the P-type diffusion regions 2b, 3b and 4b as the guard rings using the patterned silicon dioxide film.

Next, the silicon dioxide film thus used as a mask is removed. A silicon dioxide film is deposited on the first main surface of the substrate 1b, and a window is formed in the silicon dioxide film using a patterned photoresist film. A P-type impurity or an acceptor is selectively diffused into the substrate 1b through the window to form the $P^+$-type patterned polysilicon films 5b and 6b as the anodes $A_1$ and $A_2$ of the respective diodes D1' and D2' using the patterned silicon dioxide film. The impurity concentration in this process is higher than that of the prior diffusion process and is controlled so that the desired breakdown voltages $V_{B1}$ and $V_{B2}$ are obtained.

After the silicon dioxide film thus used as a mask is removed, the silicon dioxide films 7b and 8b are deposited on the first main surface of the substrate 1b in sequence.

To control the threshold voltage $V_T$ of the MOS transistor M', a P-type impurity is ion-implanted into the channel region between the P-type diffusion regions 2b and 3b through the silicon dioxide film 7b.

The first and second electrodes 9b and 10b are formed by an evaporation method. Then, a pellet of the semiconductor device is obtained.

In FIG. 6, circular lines $2d_1'$ and $2d_2'$ show the inner and outer edges of the P-type diffusion region 2b, respectively, and a circular line $5d_1'$ shows the outer edge of the $P_+$-type polysilicon film 5b. Circular lines $3d_1'$ and $3d_2'$ show the inner and outer edges of the P-type diffusion region 3b, respectively. Circular lines $6d'_1$ and $6d_2'$ show the inner and outer edges of the $P^+$-type polysilicon film 6b, respectively. Circular lines $4d'_1$ and $4d_2'$ show the inner and outer edges of the P-type diffusion region 4b, respectively. A circular line $9d_2'$ shows the outer edge of the first electrode 9b and a circular line $7d_2'$ shows the outer edge of the silicon dioxide film 7b.

For example, in case that the signal voltage $V_S$ is 5 V or less, the breakdown voltages $V_{B1}$ and $V_{B2}$ are set to be about 6 V and the threshold voltage $V_T$ is controlled to be about 5.5 V. When the signal voltage $V_S$ is 5 V or less, only the first diode D1' is effective so that the capacitance between the first and second electrodes 9b and 10b is small.

When the signal voltage $V_S$ is higher than the threshold voltage $V_T$ or 5.5 V and lower than the breakdown voltages $V_{B1}$ and $V_{B2}$ or 6 V, both of the first and second diodes D1' and D2' are effective to increase the P-N junction area. The capacitance becomes larger dependent upon increase in the signal voltage $V_S$.

When the signal voltage $V_S$ is higher than the breakdown voltages $V_{B1}$ and $V_{B2}$ or 6 V, both of the first and second diodes D1 and D2 are broken down to absorb applied electrostatic energy, so that the withstand voltage between the first and second electrodes 9b and 10b becomes several times as high as those of the conventional ones or more.

In addition, when the inner diameter of the P-type diffusion region 3a as the guard ring of the second diode D2 is about 80 μm or less, the capacitance between the first and second electrodes 9a and 10a is about 10 pF or less, which is very small, under application of the signal voltage $V_S$ is lower than the threshold voltage $V_T$.

As described above, with the semiconductor device according to the second embodiment, the polysilicon films 5b and 6b are provided in place of the Pt-type diffusion regions 5a and 6a in the first embodiment, so that the same advantage and effect as in the first embodiment can be obtained.

[Third Embodiment]

Figure 8:
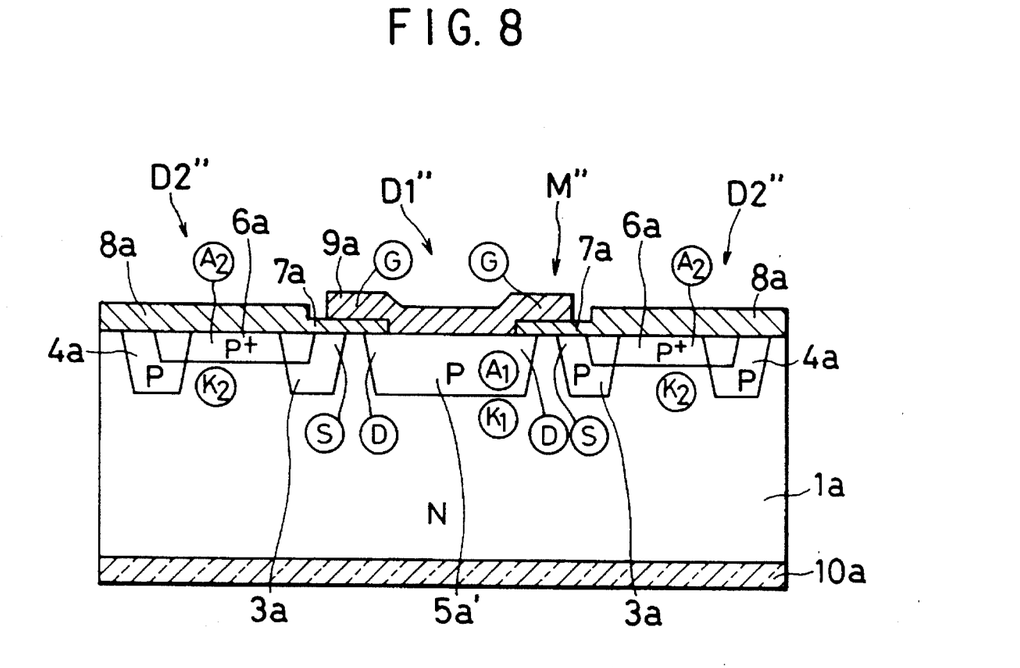
FIG. 8 is a cross-sectional view of a semiconductor device according to a third embodiment of the present invention.

FIG. 8 shows a semiconductor device of a third embodiment in which first and second voltage regulator diodes or Zener diodes D1" and D2" and an MOS transistor M" are provided on the first main surface of the N-type silicon substrate 1a to protect ICs (not shown) to which the diodes D1" and D2" are connected against electrostatic charges.

The semiconductor device of the third embodiment is the same in configuration as that of the first embodiment excepting that (a) no P-type diffusion region 2a as the guard ring is provided in the substrate 1a and (b) the relationships among the breakdown voltages $V_{B1}$ and $V_{B2}$ and the threshold voltage $V_T$ are different from those of the first embodiment. As shown in FIG. 8, a P-type diffusion region 5a' is formed in the substrate 1a to form the P-N junction of the first diode D1". The region 5a' is substantially the same in depth as the P-type diffusion regions 3a and 4a.

An equivalent circuit of the semiconductor device is the same as that in FIG. 7.

In the third embodiment, the breakdown voltage $V_{B1}$ of the P-N junction of the first diode D1" is set to be higher than the threshold voltage $V_T$ and the breakdown voltage $V_{B2}$ of the P-N junction of the second diode D2" is set to be lower than the threshold voltage $V_T$. The threshold voltage $V_T$ is controlled to be higher than the signal voltage $V_S$.

The semiconductor device of the third embodiment is fabricated through substantially the same process sequence as that in the first embodiment except that no process step for forming the P-type diffusion region 2a is carried out.

With the semiconductor device according to the third embodiment, a P-type inversion layer is formed in the channel region between the first and second diffusion regions 5a' and 3a when the signal voltage $V_S$ applied is equal to or higher than the threshold voltage $V_T$, so that electrically connection between the diffusion regions 5a' and 3a is generated through the inversion layer.

When the signal voltage $V_S$ lower than the threshold voltage $V_T$ is applied across the first and second electrodes 9a and 10a, the diffusion regions 5a' and 3a are insulated from each other, which means that only the first diode D1" having the higher breakdown voltage $V_{B1}$ is effective. Therefore, leakage current can be limited small.

When the signal voltage $V_S$ is equal to or higher than the threshold voltage $V_T$, the diffusion regions 5a' and 3a are electrically connected with each other through the inversion layer and at the same time, the second diode D2" having the lower breakdown voltage $V_{B3}$ becomes short due to its breakdown to absorb applied electrostatic energy.

As a result, the semiconductor device of the third embodiment is available for protecting ICs whose signal voltages are equal to or less than 5 V.

[Fourth Embodiment]

Figure 9:
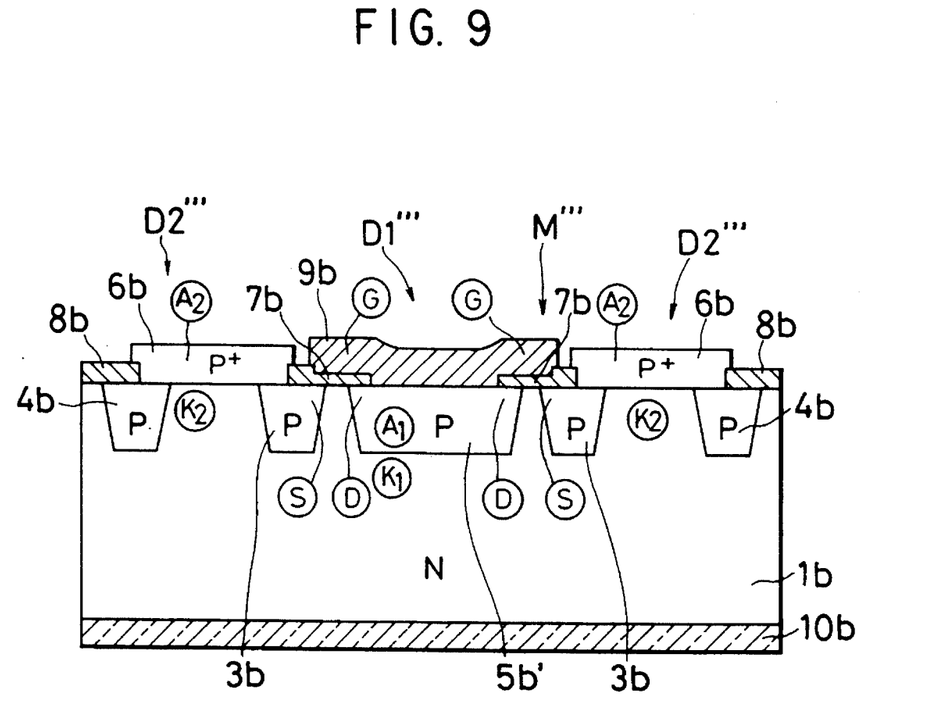
FIG. 9 is a cross-sectional view of a semiconductor device according to a fourth embodiment of the present invention.

FIG. 9 shows a semiconductor device of a fourth embodiment in which first and second voltage regulator diodes or Zener diodes D1'" and D2'" and an MOS transistor M'" are provided on the first main surface of the N-type silicon substrate 1b to protect ICs (not shown) to which the diodes D1'" and D2'" are connected against electrostatic charges.

The semiconductor device of the fourth embodiment is the same in configuration as that of the second embodiment in FIG. 5 excepting that (a) no P-type diffusion region 2b as the guard ring is provided in the substrate 1b, (b) a P-type diffusion region 5b' is formed in the substrate 1b to form the P-N junction of the first diode D1'" instead of the Pt-type polysilicon film 5b, and (c) the relationships among the breakdown voltages $V_{B1}$ and $V_{B2}$ and the threshold voltage $V_T$ are different from those of the second embodiment. As shown in FIG. 9, the region 5b' is substantially the same in depth as the P-type diffusion regions 3b and 4b.

In the fourth embodiment, the relationships among the breakdown voltages $V_{B1}$ and $V_{B2}$ and the threshold voltage $V_T$ are the same as those of the third embodiment in FIG. 8.

An equivalent circuit of the semiconductor device is the same as that in FIG. 7.

The semiconductor device of the fourth embodiment is fabricated through substantially the same process sequence as that of the second embodiment excepting that no process step for forming the P-type diffusion region 2b is carried out, and the process step for forming the P-type diffusion region 5b' is carried out instead of that for forming the $P_+$-type polysilicon film 5b.

Similar to the third embodiment, with the semiconductor device according to the fourth embodiment, an P-type inversion layer is formed in the channel region between the diffusion region 5b' and the polysilicon film 6b when the signal voltage $V_S$ applied is equal to or higher than the threshold voltage $V_T$. Therefore, electrically connection between the diffusion region 5b' and the polysilicon film 6b is generated through the inversion layer.

When the signal voltage $V_S$ is lower than the threshold voltage $V_T$, the diffusion region 5b' and the polysilicon film 6b are insulated from each other, which means that only the first diode D1''' having the higher breakdown voltage $V_{B1}$ is effective. Therefore, leakage current can be limited small.

When the signal voltage $V_S$ is equal to or higher than the threshold voltage $V_T$, the diffusion region $5b'$ and the polysilicon film $6b$ are electrically connected with each other through the inversion layer and at the same time, the second diode D2''' having the lower breakdown voltage $V_{B2}$ becomes short due to its breakdown to absorb applied electrostatic energy.

As a result, the semiconductor device of the fourth embodiment is also available for protecting ICs whose signal voltages are equal to or less than 5 V.

In the present invention, it is sufficient that first and second diodes which are parallel-connected and an MOS transistor connected serially to one of the diodes are provided on the semiconductor substrate. Thus, any configurations other than those described herewith are applicable for the diodes and MOS transistor.

It is needless to say that the present invention is not restricted to the above first to fourth embodiments, and any other variations can be made.

What is claimed is:

1. A semiconductor device for electrostatic-charge protection comprising:

a semiconductor substrate of a first conductivity type;

an insulator film formed on a first main surface of said substrate, said insulator film having a window through which said first main surface is exposed;

a first voltage regulator diode composed of a first region of said first conductivity type and a second region of a second conductivity type, said first and second regions forming a first main P-N junction at their contact area;

a first electrode formed on said insulator film;

said second region being in contact with said first electrode through said window of said insulator film;

said first region being connected with said substrate;

a second voltage regulator diode composed of a third region of said first conductivity type and a fourth region of said second conductivity type, said third and fourth regions forming a second main P-N junction at their contact area;

said third region being in contact with said substrate;

said fourth region being adapted to be connected with said second region through a channel region;

said channel region being deposited between said second and fourth regions at said first main surface of said substrate, said channel region being deposited under said insulator film and said first electrode; and a second electrode formed on a second main surface of said substrate;

wherein an inversion layer of said second conductivity type is formed at said channel region when a voltage at least equal to a threshold voltage is applied across said first and second electrodes, so that said second and fourth regions are electrically connected through said inversion layer;

the breakdown voltage of said first P-N junction is higher than said threshold voltage and the breakdown voltage of said second P-N junction is lower than said threshold voltage;

and wherein said first diode and second diode are electrically connected in parallel to said first electrode and said second electrode under application of said voltage at least equal to said threshold voltage across said first electrode and said second electrode, providing electrostatic energy absorption by both of said first diode and said second diode.

2. A semiconductor device according to claim 1, wherein said first main P-N junction and said second main P-N junction are formed in said substrate.

3. A semiconductor device according to claim 1, wherein said first main P-N junction is formed in said substrate and said second main P-N junction is formed on said first main surface of said substrate.

4. A semiconductor device for electrostatic-charge protection comprising:

a semiconductor substrate of a first conductivity type;

a first insulator film formed on a first main surface of said substrate, said first insulator film having a window through which said first main surface is exposed;

a first diode region of a second conductivity type opposite to said first conductivity type, said first diode region being formed in said substrate;

said first diode region and said substrate forming a first main P-N junction of a first voltage regulator diode at their contact area;

a first electrode formed on said first insulator film and in contact with said first diode region through said window of said first insulator film;

a second diode region of said second conductivity type, said second diode region being formed in said substrate apart from said first diode region;

said second diode region and said substrate forming a second main P-N junction of a second voltage regulator diode at their contact area;

a second insulator film formed on said first main surface of said substrate so as to cover said second diode region; and a second electrode formed on a second main surface of said substrate;

wherein an inversion layer of said second conductivity type is formed at a channel region when a voltage at least equal to a threshold voltage is applied across said first and second electrodes, so that said first diode region is electrically connected with said second diode region through said inversion layer;

the breakdown voltage of said first P-N junction is higher than said threshold voltage and the breakdown voltage of said second P-N junction is lower than said threshold voltage;

and wherein said first diode and said second diode are electrically connected in parallel to said first electrode and said second electrode under application of said voltage at least equal to said threshold voltage across said first electrode and said second electrode, providing electrostatic energy absorption by both of said first diode and said second diode.

5. A semiconductor device as claimed in claim 4, wherein said first diode region is of a circular plan shape, said second diode region is of a circular-ringed plan shape, and said second diode region is deposited to surround said first diode region.

6. A semiconductor device as claimed in claim 5, further comprising a pair of guard rings for said second diode region;

one of said pair of guard rings being formed to along the inner edge of said second diode region in said substrate; and the other of said pair of guard rings being formed along the outer edge of said second diode region in said substrate.

7. A semiconductor device for electrostatic-charge protection comprising:

a semiconductor substrate of a first conductivity type;

an insulator film formed on a first main surface of said substrate, said insulator film having a window through which said first main surface is exposed;

a diode region of a second conductivity type opposite to said first conductivity type, said diode region being formed in said substrate;

said diode region and said substrate forming a first main P-N junction of a first voltage regulator diode at their contact area;

a first electrode formed on said insulator film and in contact with said diode region through said window of said insulator film;

a patterned conductive film of said second conductivity type, said patterned conductive film being formed on said first main surface on said substrate apart from said diode region;

said patterned conductive film and said substrate forming a second main P-N junction of a second voltage regulator diode at their contact area; and a second electrode formed on a second main surface of said substrate;

wherein an inversion layer of said second conductivity type is formed at a channel region when a voltage at least equal to a threshold voltage is applied across said first and second electrodes, so that said diode region is electrically connected with said patterned conductive film through said inversion layer;

the breakdown voltage of said first P-N junction is higher than said threshold voltage and the breakdown voltage of said second P-N junction is lower than said threshold voltage;

and wherein said first diode and said second diode are electrically connected in parallel to said first electrode and said second electrode under application of said voltage at least equal to said threshold voltage across said first electrode and said second electrode, providing electrostatic energy absorption by both of said first diode and said second diode.

8. A semiconductor device as claimed in claim 7, wherein said diode region is of a circular plan shape, said patterned conductive film is of a circular-ringed plan shape, and said patterned conductive film is deposited to surround said first diode region.

9. A semiconductor device as claimed in claim 8, further comprising a pair of guard rings for said patterned conductive film;

one of said pair of guard rings being formed to along the inner edge of said patterned conductive film in said substrate; and the other of said pair of guard rings being formed along the outer edge of said patterned conductive film in said substrate.

* * * * *